US008724060B2

(12) United States Patent
Zhang

(10) Patent No.: US 8,724,060 B2
(45) Date of Patent: May 13, 2014

(54) METHOD FOR MANUFACTURING LIQUID CRYSTAL DISPLAY MODULE WITH PHOTOVOLTAIC CELL AND LIQUID CRYSTAL DISPLAY MODULE MANUFACTURED WITH SAME

(75) Inventor: Xindi Zhang, Guandong (CN)

(73) Assignee: Shenzhen China Star Optoelectronics Technology co., Ltd., Shenzhen, Guangdong (CN)

( * ) Notice: Subject to any disclaimer, the term of this patent is extended or adjusted under 35 U.S.C. 154(b) by 71 days.

(21) Appl. No.: 13/698,035

(22) PCT Filed: Aug. 10, 2012

(86) PCT No.: PCT/CN2012/079918
§ 371 (c)(1),
(2), (4) Date: Nov. 14, 2012

(87) PCT Pub. No.: WO2014/019251
PCT Pub. Date: Feb. 6, 2014

(65) Prior Publication Data
US 2014/0036177 A1    Feb. 6, 2014

(30) Foreign Application Priority Data

Aug. 2, 2012  (CN) .......................... 2012 1 0273290

(51) Int. Cl.
*G02F 1/133*    (2006.01)
(52) U.S. Cl.
USPC ............................... 349/116; 438/29; 438/30

(58) Field of Classification Search
USPC ........................................ 349/116; 438/29, 30
See application file for complete search history.

(56) References Cited

U.S. PATENT DOCUMENTS

| 7,906,356 | B2 * | 3/2011 | Song et al. ...................... 438/30 |
| 2010/0163873 | A1 | 7/2010 | Cho et al. |
| 2011/0317121 | A1 | 12/2011 | Lin et al. |
| 2012/0194775 | A1 * | 8/2012 | Kawakami et al. ........... 349/139 |

FOREIGN PATENT DOCUMENTS

| CN | 101900898 A | 12/2010 |
| CN | 102109701 A | 6/2011 |
| CN | 102478678 A | 5/2012 |

* cited by examiner

*Primary Examiner* — Lucy Chien
(74) *Attorney, Agent, or Firm* — Andrew C. Cheng

(57) ABSTRACT

The present invention provides a method for manufacturing liquid crystal display module with photovoltaic cell, which includes: (1) providing a substrate and a liquid crystal display panel; (2) forming a transparent conductive layer on the substrate through sputtering; (3) forming a first matrix, which is arranged to stay away from a pixel aperture of the liquid crystal display panel and is located below the TFT arrays; (4) forming a photovoltaic layer on the transparent conductive layer through chemical vapor deposition; (5) forming a second matrix corresponding to the first matrix; (6) forming a metal layer on the photovoltaic layer through sputtering; (7) forming a third matrix corresponding to the second matrix so as to form a photovoltaic cell on the substrate; (8) applying sealant to the substrate around the photovoltaic cell; and (9) bonding the substrate and the liquid crystal display panel to each other and curing the sealant.

11 Claims, 2 Drawing Sheets

METHOD FOR MANUFACTURING LIQUID CRYSTAL DISPLAY MODULE WITH PHOTOVOLTAIC CELL AND LIQUID CRYSTAL DISPLAY MODULE MANUFACTURED WITH SAME

BACKGROUND OF THE INVENTION

1. Field of the Invention

The present invention relates to the field of liquid crystal displaying, and in particular to a method for manufacturing a liquid crystal display module with photovoltaic cell and a liquid crystal display module manufactured with the same.

2. The Related Arts

Liquid crystal display (LCD) has a variety of advantages, such as thin device body, low power consumption, and being free of radiation, and is thus widely used. Most of the LCDs that are currently available in the market are backlighting LCDs, which comprise a liquid crystal display panel and a backlight module. The operation principle of the liquid crystal display panel is that liquid crystal molecules are interposed between two parallel glass substrates and the liquid crystal molecules are controlled to change direction by application of electricity to the glass substrates in order to refract light emitting from the backlight module for generating images. Since the liquid crystal display panel itself does not emit light, light must be provided by the backlight module in order to normally display images. Thus, the backlight module is one of the key components of an LCD. The backlight module can be classified in two types, namely side-edge backlight module and direct backlight module, according to the position where light gets incident. The direct backlight module arranges a light source, such as a cold cathode fluorescent lamp (CCFL) or a light-emitting diode (LED), at the back side of the liquid crystal display panel to form a planar light source that directly provides lighting to the liquid crystal display panel. The side-edge backlight module arranges a backlight source of LED light bar at an edge of a back panel to be located rearward of one side of the liquid crystal display panel. The LED light bar emits light that enters a light guide plate (LGP) through a light incident face of the light guide plate and is projected out through a light emergence face of the light guide plate, after being reflected and diffused, to thereby transmit through an optic film assembly and form a planar light source for the liquid crystal display panel. However, there is only about 6% of the light emitting from the backlight source that can transmit through the liquid crystal display panel. This cause a waste of a large amount of light energy.

A liquid crystal display panel is generally composed of a color filter (CF) substrate, a thin film transistor (TFT) substrate, and liquid crystal (LC) and sealant interposed between the CF substrate and the TFT substrate. A general manufacturing process comprises a front stage of array process (including thin film, yellow light, etching, and film stripping), an intermediate stage of cell process (including bonding TFT substrate and CF substrate), and a rear stage of assembling process (including mounting drive ICs and printed circuit board). The front stage of array process generally makes the TFT substrate for controlling the movement of liquid crystal molecules. The intermediate stage of cell process generally introduces the liquid crystal between the TFT substrate and the CF substrate. The rear stage of assembling process generally mounts the drive ICs and combining the printed circuit board to effect driving the liquid crystal molecules to rotate for displaying images.

The current TFT substrate comprises first and second metal electrodes that shield the light of the backlight module to some extents, preventing the light from the backlight module from being completely used by a liquid crystal display panel and thus causing a loss of photo energy.

A photovoltaic cell is a device that directly converts photo energy into electrical energy through photoelectrical effect or photochemical effect. To improve the utilization of light from the backlight module of a liquid crystal display device, those skilled in the art include photovoltaic cells in the liquid crystal display panel. The photovoltaic cells absorb excessive photo energy and convert the photo energy into electrical energy to power components or accessories of the liquid crystal display panel. Photo energy emitting from the backlight source can thus be fully used and the consumption of external power sources can be reduced.

However, the current manufacturing techniques only work to integrate already-manufactured photovoltaic cells with the liquid crystal display panel. The manufacturing process is complicated and the manufacture cycle is long, so that the manufacture cost is increased. Further, the photovoltaic cell is susceptible to corrosion caused by external humidity and oxygen, making the lifespan of the photovoltaic cell shortened.

SUMMARY OF THE INVENTION

An object of the present invention is to provide a method for manufacturing a liquid crystal display module with photovoltaic cell, which forms a photovoltaic cell on a liquid crystal display panel in order to effectively use the photo energy of a backlight module, reduce the consumption of an external power source, and thus lower down manufacture cost, and also effectively protect the photovoltaic cell so as to extend the lifespan of the photovoltaic cell.

Another object of the present invention is to provide a liquid crystal display module with photovoltaic cell, which effectively uses the photo energy of a backlight module, reduces the consumption of an external power source, and lowers down manufacture cost.

To achieve the objects, the present invention provides a method for manufacturing liquid crystal display module with photovoltaic cell, which comprises the following steps:

Step 1: providing a substrate and a liquid crystal display panel, wherein the liquid crystal display panel comprises a plurality of TFT arrays formed thereon with a pixel aperture formed between every two TFT arrays;

Step 2: forming a transparent conductive layer on the substrate through sputtering;

Step 3: applying photo masking and wet etching operation to subject the transparent conductive layer to etching to form a first matrix, wherein the first matrix is arranged to stay away from the pixel aperture of the liquid crystal display panel and is located below the TFT arrays;

Step 4: forming a photovoltaic layer on the transparent conductive layer through chemical vapor deposition;

Step 5: applying photo masking and dry etching operation to subject the photovoltaic layer to etching to form a second matrix corresponding to the first matrix;

Step 6: forming a metal layer on the photovoltaic layer through sputtering;

Step 7: applying photo masking and wet etching operation to subject the metal layer to etching to form a third matrix corresponding to the second matrix so as to form a photovoltaic cell on the substrate;

Step 8: applying sealant to the substrate around the photovoltaic cell; and

Step 9: bonding the substrate and the liquid crystal display panel to each other and curing the sealant.

The substrate comprises a glass substrate.

The transparent conductive layer comprises an indium tin oxides layer.

The photovoltaic layer comprises a monocrystalline silicon layer, a polysilicon layer, or an amorphous silicon layer.

The metal layer comprises an aluminum layer.

The liquid crystal display panel comprises a TFT substrate, a CF substrate bonded to the TFT substrate, and liquid crystal arranged between the TFT substrate and the CF substrate.

The plurality of TFT arrays is formed on the TFT substrate. Each of the TFT arrays comprises a first and a second metal electrodes. The photovoltaic cell is formed below and corresponding to the first and second metal electrodes.

The present invention also provides a method for manufacturing liquid crystal display module with photovoltaic cell, which comprises the following steps:

Step 1: providing a substrate and a liquid crystal display panel, wherein the liquid crystal display panel comprises a plurality of TFT arrays formed thereon with a pixel aperture formed between every two TFT arrays;

Step 2: forming a transparent conductive layer on the substrate through sputtering;

Step 3: applying photo masking and wet etching operation to subject the transparent conductive layer to etching to form a first matrix, wherein the first matrix is arranged to stay away from the pixel aperture of the liquid crystal display panel and is located below the TFT arrays;

Step 4: forming a photovoltaic layer on the transparent conductive layer through chemical vapor deposition;

Step 5: applying photo masking and dry etching operation to subject the photovoltaic layer to etching to form a second matrix corresponding to the first matrix;

Step 6: forming a metal layer on the photovoltaic layer through sputtering;

Step 7: applying photo masking and wet etching operation to subject the metal layer to etching to form a third matrix corresponding to the second matrix so as to form a photovoltaic cell on the substrate;

Step 8: applying sealant to the substrate around the photovoltaic cell; and

Step 9: bonding the substrate and the liquid crystal display panel to each other and curing the sealant;

wherein the substrate comprises a glass substrate;

wherein the transparent conductive layer comprises an indium tin oxides layer;

wherein the photovoltaic layer comprises a monocrystalline silicon layer, a polysilicon layer, or an amorphous silicon layer;

wherein the metal layer comprises an aluminum layer;

wherein the liquid crystal display panel comprises a TFT substrate, a CF substrate bonded to the TFT substrate, and liquid crystal arranged between the TFT substrate and the CF substrate; and wherein the plurality of TFT arrays is formed on the TFT substrate, each of the TFT arrays comprising a first and a second metal electrodes, the photovoltaic cell being formed below and corresponding to the first and second metal electrodes.

The present invention also provides a liquid crystal display module with photovoltaic cell, which comprises a substrate, a liquid crystal display panel bonded to the substrate, and sealant arranged between the substrate and the liquid crystal display panel. The substrate comprises a photovoltaic cell formed thereon. The photovoltaic cell comprises a first matrix formed on the substrate, a second matrix formed on the first matrix, and a third matrix formed on the second matrix. The first matrix is formed by applying photo masking and wet etching operation to a transparent conductive layer. The second matrix is formed by applying photo masking and dry etching operation to a photovoltaic layer. The third matrix is formed by applying photo masking and wet etching operation to a metal layer.

The substrate comprises a glass substrate. The transparent conductive layer comprises an indium tin oxides layer. The photovoltaic layer comprises a monocrystalline silicon layer, a polysilicon layer, or an amorphous silicon layer. The metal layer comprises an aluminum layer.

The liquid crystal display panel comprises a TFT substrate, a CF substrate bonded to the TFT substrate, and liquid crystal arranged between the TFT substrate and the CF substrate. The TFT substrate comprises a plurality of TFT arrays formed thereon. Each of the TFT arrays comprises a first and a second metal electrodes. The photovoltaic cell is formed below and corresponding to the first and second metal electrodes.

The efficacy of the present invention is that the present invention provides a method for manufacturing a liquid crystal display module with photovoltaic cell and a liquid crystal display module manufactured with same, which form a photovoltaic cell on a substrate and then bond the substrate to a liquid crystal display panel with sealant so that the photovoltaic cell is embedded in the liquid crystal display module with a simple process thereby allowing the components or accessories of a liquid crystal display device to be powered with light emitting from a backlight module for making a full use of the photo energy emitting from the backlight module and reducing consumption of external electrical power, and also to effectively protect the photovoltaic cell against damage caused on the photovoltaic cell by external humidity and oxygen to thereby extend the lifespan of the photovoltaic cell.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
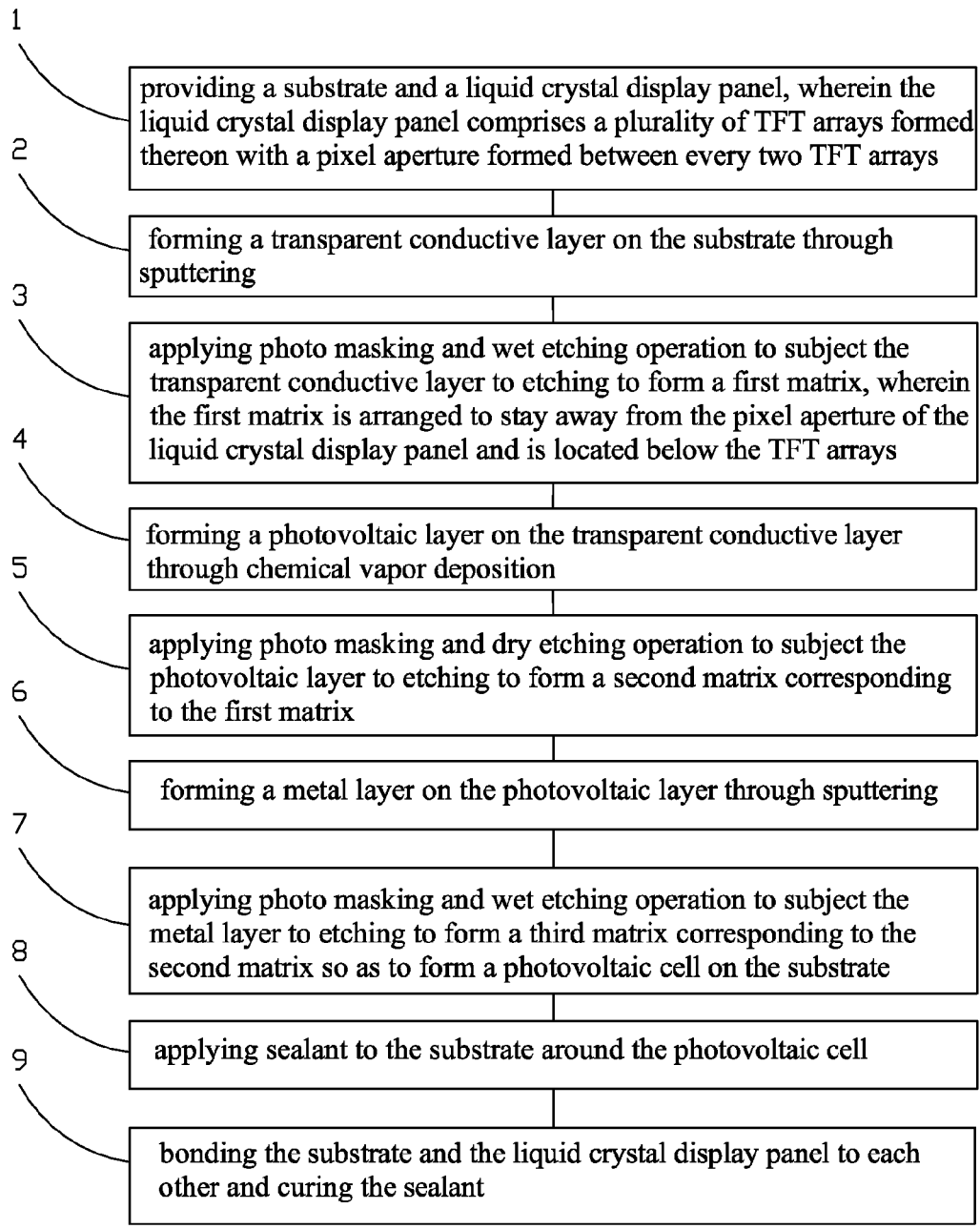
FIG. 1 is a flow chart illustrating a method for manufacturing a liquid crystal display module with photovoltaic cell according to the present invention.
Figure 2:
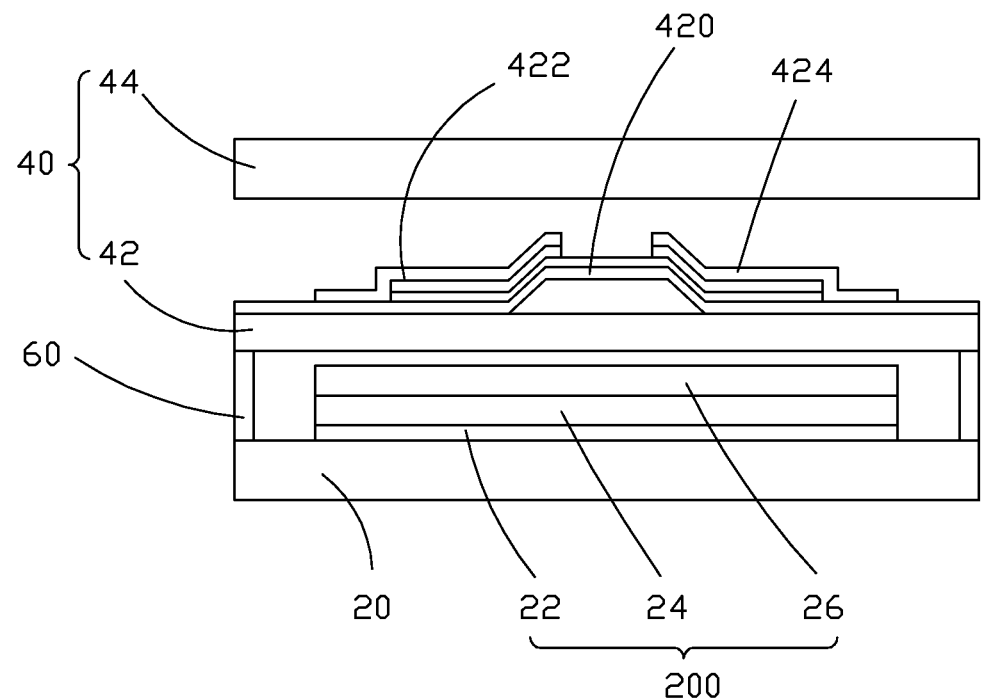
FIG. 2 is a schematic view showing the structure of a liquid crystal display module with photovoltaic cell according to the present invention.

Referring to FIGS. 1 and 2, the present invention provides a method for manufacturing a liquid crystal display module with photovoltaic cell, which comprises the following steps:

Step 1: providing a substrate 20 and a liquid crystal display panel 40, wherein the liquid crystal display panel 40 comprises a plurality of TFT arrays 420 formed thereon with a pixel aperture (not shown) formed between every two TFT arrays 420.

The liquid crystal display panel 40 comprises a TFT substrate 42, a CF substrate 44 bonded to the TFT substrate 42, and liquid crystal (not shown) arranged between the TFT substrate 42 and the CF substrate 44. The TFT arrays 420 are formed on the TFT substrate 42 and the TFT arrays 420 comprise first and second metal electrodes 422, 424.

Step 2: forming a transparent conductive layer on the substrate 20 through sputtering.

The transparent conductive layer comprises an indium tin oxides (ITO) layer, which is formed on the substrate 20 through sputtering.

Step 3: applying photo masking and wet etching operation to subject the transparent conductive layer to etching to form a first matrix 22. The first matrix is arranged to stay away from the pixel aperture of the liquid crystal display panel 40 and is located below the TFT arrays 420 and is preferably located below the first and second metal electrodes 422, 424 and circuit wiring (not shown).

Step 4: forming a photovoltaic layer on the transparent conductive layer through chemical vapor deposition (CVD).

The photovoltaic layer comprises a monocrystalline silicon layer, a polysilicon layer, or an amorphous silicon layer, which is formed on the transparent conductive layer through chemical vapor deposition.

Step 5: applying photo masking and dry etching operation to subject the photovoltaic layer to etching to form a second matrix 24 corresponding to the first matrix 22.

Step 6: forming a metal layer on the photovoltaic layer through sputtering.

In the instant embodiment, the metal layer comprises an aluminum layer, which is formed on the photovoltaic layer through sputtering.

Step 7: applying photo masking and wet etching operation to subject the metal layer to etching to form a third matrix 26 corresponding to the second matrix 24 so as to form a photovoltaic cell 200 on the substrate 20.

Step 8: applying sealant 60 to the substrate 20 around the photovoltaic cell 200.

Step 9: bonding the substrate 20 and the liquid crystal display panel 40 to each other and curing the sealant 60.

The substrate 20 on which the photovoltaic cell 200 is formed is bonded to the liquid crystal display panel 40. In making the bonding, the photovoltaic cell 200 is set below the first and second metal electrodes 422, 424 in order to make a full use of the photo energy that is blocked from transmitting through the TFT substrate 42. The sealant 60 is cured through application of high temperature so as to securely and tightly bond the substrate 20 and the liquid crystal display panel 40 together. Besides providing a bonding effect, the sealant 60 protects the photovoltaic cell 200 located inboard the sealant from corrosion caused by external humidity and oxidization caused by oxygen thereby extending the lifespan of the photovoltaic cell 200 and thus extending the lifespan of the liquid crystal display module according to the present invention.

Referring to FIG. 2, the present invention also provides a liquid crystal display module with photovoltaic cell, which comprises a substrate 20, a liquid crystal display panel 40 bonded to the substrate 20, and sealant 60 arranged between the substrate 20 and the liquid crystal display panel 40. The substrate 20 comprises a photovoltaic cell 200 formed thereon. The photovoltaic cell 200 comprises a first matrix 22 formed on the substrate 20, a second matrix 24 formed on the first matrix 22, and a third matrix 26 formed on the second matrix 24.

The first matrix 22 is formed by applying photo masking and wet etching operation to a transparent conductive layer. The second matrix 24 is formed by applying photo masking and dry etching operation to a photovoltaic layer. The third matrix 26 is formed by applying photo masking and wet etching operation to a metal layer.

In the instant embodiment, the transparent conductive layer is an indium tin oxides layer, which is formed on the substrate 20 through sputtering. The photovoltaic layer can be a monocrystalline silicon layer, a polysilicon layer, or an amorphous silicon layer, which is formed on the transparent conductive layer through chemical vapor deposition. The metal layer is an aluminum layer, which is formed on the photovoltaic layer through sputtering.

The liquid crystal display panel 40 comprises a TFT substrate 42, a CF substrate 44 bonded to the TFT substrate 42, and liquid crystal (not shown) arranged between the TFT substrate 42 and the CF substrate 44. A plurality of TFT arrays 420 is formed on the TFT substrate 42 and each of the TFT arrays 420 comprises a first and a second metal electrodes 422, 424.

The sealant 60 is arranged around the photovoltaic cell 200 to well protect the photovoltaic cell 200 against corrosion caused by external humidity and oxidization caused by oxygen so as to extend the lifespan of the photovoltaic cell 200 and thus extending the lifespan of the liquid crystal display module according to the present invention.

In summary, the present invention provides a method for manufacturing a liquid crystal display module with photovoltaic cell and a liquid crystal display module manufactured with same, which form a photovoltaic cell on a substrate and then bond the substrate to a liquid crystal display panel with sealant so that the photovoltaic cell is embedded in the liquid crystal display module with a simple process thereby allowing the components or accessories of a liquid crystal display device to be powered with light emitting from a backlight module for making a full use of the photo energy emitting from the backlight module and reducing consumption of external electrical power, and also to effectively protect the photovoltaic cell against damage caused on the photovoltaic cell by external humidity and oxygen to thereby extend the lifespan of the photovoltaic cell.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing liquid crystal display module with photovoltaic cell, comprising the following steps:
   (1) providing a substrate and a liquid crystal display panel, wherein the liquid crystal display panel comprises a plurality of TFT arrays formed thereon with a pixel aperture formed between every two TFT arrays;
   (2) forming a transparent conductive layer on the substrate through sputtering;
   (3) applying photo masking and wet etching operation to subject the transparent conductive layer to etching to form a first matrix, wherein the first matrix is arranged to stay away from the pixel aperture of the liquid crystal display panel and is located below the TFT arrays;
   (4) forming a photovoltaic layer on the transparent conductive layer through chemical vapor deposition;
   (5) applying photo masking and dry etching operation to subject the photovoltaic layer to etching to form a second matrix corresponding to the first matrix;

(6) forming a metal layer on the photovoltaic layer through sputtering;

(7) applying photo masking and wet etching operation to subject the metal layer to etching to form a third matrix corresponding to the second matrix so as to form a photovoltaic cell on the substrate;

(8) applying sealant to the substrate around the photovoltaic cell; and (9) bonding the substrate and the liquid crystal display panel to each other and curing the sealant.

2. The method for manufacturing liquid crystal display module with photovoltaic cell as claimed in claim 1, wherein the substrate comprises a glass substrate.

3. The method for manufacturing liquid crystal display module with photovoltaic cell as claimed in claim 1, wherein the transparent conductive layer comprises an indium tin oxides layer.

4. The method for manufacturing liquid crystal display module with photovoltaic cell as claimed in claim 1, wherein the photovoltaic layer comprises a monocrystalline silicon layer, a polysilicon layer, or an amorphous silicon layer.

5. The method for manufacturing liquid crystal display module with photovoltaic cell as claimed in claim 1, wherein the metal layer comprises an aluminum layer.

6. The method for manufacturing liquid crystal display module with photovoltaic cell as claimed in claim 1, wherein the liquid crystal display panel comprises a TFT substrate, a CF substrate bonded to the TFT substrate, and liquid crystal arranged between the TFT substrate and the CF substrate.

7. The method for manufacturing liquid crystal display module with photovoltaic cell as claimed in claim 6, wherein the plurality of TFT arrays is formed on the TFT substrate, each of the TFT arrays comprising a first and a second metal electrodes, the photovoltaic cell being formed below and corresponding to the first and second metal electrodes.

8. A method for manufacturing liquid crystal display module with photovoltaic cell, comprising the following steps:

(1) providing a substrate and a liquid crystal display panel, wherein the liquid crystal display panel comprises a plurality of TFT arrays formed thereon with a pixel aperture formed between every two TFT arrays;

(2) forming a transparent conductive layer on the substrate through sputtering;

(3) applying photo masking and wet etching operation to subject the transparent conductive layer to etching to form a first matrix, wherein the first matrix is arranged to stay away from the pixel aperture of the liquid crystal display panel and is located below the TFT arrays;

(4) forming a photovoltaic layer on the transparent conductive layer through chemical vapor deposition;

(5) applying photo masking and dry etching operation to subject the photovoltaic layer to etching to form a second matrix corresponding to the first matrix;

(6) forming a metal layer on the photovoltaic layer through sputtering;

(7) applying photo masking and wet etching operation to subject the metal layer to etching to form a third matrix corresponding to the second matrix so as to form a photovoltaic cell on the substrate;

(8) applying sealant to the substrate around the photovoltaic cell; and (9) bonding the substrate and the liquid crystal display panel to each other and curing the sealant;

wherein the substrate comprises a glass substrate;

wherein the transparent conductive layer comprises an indium tin oxides layer;

wherein the photovoltaic layer comprises a monocrystalline silicon layer, a polysilicon layer, or an amorphous silicon layer;

wherein the metal layer comprises an aluminum layer;

wherein the liquid crystal display panel comprises a TFT substrate, a CF substrate bonded to the TFT substrate, and liquid crystal arranged between the TFT substrate and the CF substrate; and wherein the plurality of TFT arrays is formed on the TFT substrate, each of the TFT arrays comprising a first and a second metal electrodes, the photovoltaic cell being formed below and corresponding to the first and second metal electrodes.

9. A liquid crystal display module with photovoltaic cell, comprising a substrate, a liquid crystal display panel bonded to the substrate, and sealant arranged between the substrate and the liquid crystal display panel, the substrate comprising a photovoltaic cell formed thereon, the photovoltaic cell comprising a first matrix formed on the substrate, a second matrix formed on the first matrix, and a third matrix formed on the second matrix, the first matrix being formed by applying photo masking and wet etching operation to a transparent conductive layer, the second matrix being formed by applying photo masking and dry etching operation to a photovoltaic layer, the third matrix being formed by applying photo masking and wet etching operation to a metal layer.

10. The liquid crystal display module with photovoltaic cell as claimed in claim 9, wherein the substrate comprises a glass substrate, the transparent conductive layer comprising an indium tin oxides layer, the photovoltaic layer comprising a monocrystalline silicon layer, a polysilicon layer, or an amorphous silicon layer, the metal layer comprising an aluminum layer.

11. The liquid crystal display module with photovoltaic cell as claimed in claim 9, wherein the liquid crystal display panel comprises a TFT substrate, a CF substrate bonded to the TFT substrate, and liquid crystal arranged between the TFT substrate and the CF substrate, the TFT substrate comprising a plurality of TFT arrays formed thereon, each of the TFT arrays comprising a first and a second metal electrodes, the photovoltaic cell being formed below and corresponding to the first and second metal electrodes.

* * * * *